(12) United States Patent
Cochran et al.

(10) Patent No.: US 6,627,963 B2
(45) Date of Patent: Sep. 30, 2003

(54) METHOD FOR FABRICATING A MERGED INTEGRATED CIRCUIT DEVICE

(75) Inventors: William T. Cochran, Clermont, FL (US); Isik C. Kizilyalli, Orlando, FL (US); Morgan J. Thoma, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 29 days.

(21) Appl. No.: 09/789,254

(22) Filed: Feb. 20, 2001

(65) Prior Publication Data

US 2001/0016391 A1 Aug. 23, 2001

Related U.S. Application Data

(62) Division of application No. 09/246,402, filed on Feb. 8, 1999, now Pat. No. 6,214,675.

(51) Int. Cl.[7] .............................................. H01L 29/76
(52) U.S. Cl. ...................... 257/392; 257/336; 257/371; 257/391; 257/408; 257/596
(58) Field of Search ................................. 438/199, 229, 438/289, 194, 275; 257/408, 336, 371, 391, 392, 596

(56) References Cited

U.S. PATENT DOCUMENTS

| 5,254,487 A | * | 10/1993 | Tamagawa | 437/34 |
|---|---|---|---|---|
| 5,468,666 A | * | 11/1995 | Chapman | 437/44 |
| 5,770,493 A | | 6/1998 | Fulford, Jr. | |
| 5,780,344 A | | 7/1998 | Hasegawa | |
| 5,786,620 A | * | 7/1998 | Richards, Jr. et al. | 257/408 |
| 5,827,761 A | | 10/1998 | Fulford, Jr. et al. | |
| 5,880,502 A | * | 3/1999 | Lee et al. | 257/372 |
| 5,976,922 A | * | 11/1999 | Tung | 438/228 |
| 5,976,938 A | | 11/1999 | Gardner et al. | |
| 6,020,227 A | | 2/2000 | Bulucea | |
| 6,033,944 A | | 3/2000 | Shida | |
| 6,054,354 A | | 4/2000 | Nowak et al. | |
| 6,133,077 A | * | 10/2000 | Randazzo | 438/199 |
| 6,277,682 B1 | * | 8/2001 | Misium | 438/199 |

\* cited by examiner

*Primary Examiner*—Richard Elms
*Assistant Examiner*—Douglas M. Menz

(57) ABSTRACT

The present invention provides a process for fabricating merged integrated circuits on a semiconductor wafer substrate. The process comprises forming a gate oxide on the semiconductor wafer substrate, forming a first transistor having a first gate on the gate oxide, and forming a second transistor having a second gate on the same gate oxide. The first transistor is optimized to a first operating voltage by varying a physical property of the first gate, varying a first tub doping profile, or varying a first source/drain doping profile. The second transistor is optimized to a second operating voltage by varying a physical property of the second gate, varying a second tub doping profile, or varying a second source/drain doping profile of the second transistor. These physical characteristics may be changed in any combination or singly to achieve the determined optimization of the operating voltage of any given transistor.

9 Claims, 6 Drawing Sheets

METHOD FOR FABRICATING A MERGED INTEGRATED CIRCUIT DEVICE

This Application is a Divisional of prior application Ser. No. 09/246,402 filed on Feb. 8, 1999, now U.S. Pat. No. 6,214,675, to William T. Cochran, et al. The above-listed Application is commonly assigned with the present invention and is incorporated herein by reference as if reproduced herein in its entirety under Rule 1.53(b).

TECHNICAL FIELD OF THE INVENTION

The present invention is directed, in general, to a method of fabricating an integrated circuit and, more specifically, to a method for fabricating a merged integrated circuit device that has different transistor technologies integrated into the same chip that are optimized for different operating voltages.

BACKGROUND OF THE INVENTION

Integrated circuits have gained extensive use over the last two decades and have been incorporated into a substantial number of electronic devices. At the same time, however, the size-of these integrated circuits have continuously shrunk in size to accommodate ever faster and smaller electronic devices. The varied application of the electronic devices into which integrated circuits have been placed has required different types of process modules. Thus, integrated circuit manufacturers responded by developing the capability to produce different types of these modules. In many cases, they devoted entire lines within a plant to the task of producing a particular process module. As customers' expectations of electronic devices have increased, manufacturers found that it was necessary to incorporate several different modules into one device, and in some cases, even into one chip.

The incorporation of these process modules, such as dense memory, FLASH devices, bipolar devices and analog components along with the core digital CMOS technologies is presently a daunting task. In the past, these enhancement modules have often incorporated processes that were significantly different than that required by the core digital process. In particular, enhancement modules typically use 3.3 volt technology while core digital circuits employ 2.5 volt technology. Also, circuits often required different combinations of these enhancement modules. This requirement has in the past meant that manufacturers have needed to develop, maintain and qualify numerous technologies to support the varied customer and product requirements.

Traditionally, the integration of various system-level components, such as precision analog functions, cache memory, and small-signal radio frequency (RF) with core logic has required the use of separate and mutually incompatible fabrication processes implemented as separate chips at the board level. Attempting to integrate RF and analog functions with digital functions on a single chip has not been possible in process technologies of 0.35 micron, or even 0.5 micron, because the processes associated with RF devices, such as bipolar or BiCMOS, have not been easily adaptable to the needs of digital components, and CMOS processes have not been capable of handling the high-frequency requirements of RF devices.

Separate chips with separate fabrication processes not only result in increased cost and time-to-market, but also place a significant burden on wafer fabrication plants to qualify and maintain multiple process technology lines—one for each of these unique components.

Another way in which manufacturers have attempted to address this problem has been to build the module around a single technology, such as a 3.3 volt technology and then to insert circuitry to accommodate a lower voltage device, such as a 2.5 volt CMOS technology. This type of design is typically built using a 0.33 micron gate with a thick gate oxide. While this type of configuration has allowed for both types of devices to operate on a single platform, the operation of the 2.5 volt device on the 3.3 volt platform has been found to have its own inherent disadvantages. For example, a transistor that is optimized for 3.3 volts but is operated at 2.5 volts will have lower drive current than a transistor that is optimized for 2.5 volts.

Accordingly, what is needed in the art is a process that economically and efficiently incorporates both 2.5 volt and 3.3 volt technologies into a single microchip.

SUMMARY OF THE INVENTION

To address the above-discussed deficiencies of the prior art, the present invention, in one embodiment, provides a process for fabricating merged integrated circuits on a semiconductor wafer substrate. The process comprises forming a gate oxide on the semiconductor wafer substrate, forming a first transistor having a first gate on the gate oxide, and forming a second transistor having a second gate on the same gate oxide. The first transistor is optimized to a first operating voltage by varying a physical property of the first gate, varying a first tub doping profile, or varying a first source/drain doping profile. The second transistor is optimized to a second operating voltage by varying a physical property of the second gate, varying a second tub doping profile, or varying a second source/drain doping profile of the second transistor. These physical characteristics may be changed in any combination or singly to achieve the determined optimization of the operating voltage of any given transistor.

Thus in a broad scope, the present invention provides merged, integrated technologies incorporating transistor optimized for different operating voltages, which allows for a wide range of device applications within a single chip. Moreover, because the gates of the transistors are formed on the same gate oxide, there are not only substantial savings in manufacturing costs, but there is also an increase in the performance of the transistor, which translates into a faster transistor.

In one embodiment, the process includes forming the first and second transistors to a same type of transistor that may be p-type or n-type transistors. In an alternative embodiment, the process further comprises forming a third transistor having a third gate on the gate oxide and optimizing the third transistor to a third operating voltage that may also be equal to either the first or second operating voltages. Optimizing the third transistor may be accomplished by varying a physical property of the third gate, varying a third tub doping profile, or varying a third source/drain doping profile, including any combination thereof.

Varying a physical property of the first gate, in alternative embodiments, may include forming the first gate length to a length different from a length of the second gate or forming the first gate length to a length substantially equal to the second gate length. In another embodiment, however, the first tub may be doped to a doping profile that is different from the second tub doping profile. Alternatively, the second tub doping profile may be substantially the same as the first tub doping profile.

In yet other embodiments, the process may vary the first source/drain doping profile to a doping profile that is substantially the same or is different from the second source/ drain doping profile. In a particularly advantageous embodiment, the gate oxide may be formed to a thickness ranging from about 1 nm to about 20 nm.

In other embodiments, the process may further be varied by: forming the first gate to a length that is different from the second gate length or doping the first tub to a doping profile that is substantially the same as the second tub doping profile. The process may also include doping the first source/drain to a doping profile that is substantially the same as the second source/drain doping profile.

The process may, in alternative embodiments, include forming the first gate to a length substantially equal to the second gate length or varying the first tub doping profile so that it is different from the second tub doping profile. This process may also include forming a first source/drain doping profile that is substantially the same as the second source/drain doping profile.

In yet other embodiments, varying a physical property of the first gate may also include forming a first gate length that is substantially equal to the gate length of the second transistor. Alternatively, the first tub doping profile may be substantially the same as the second tub doping profile or the first source/drain doping profile may be different from the second source/drain doping profile.

The transistor may, in other embodiments, be optimized by forming the first gate to a length different from the second gate or by doping the first tub doping profile to a profile that is different from the second tub doping profile. Alternatively, the first source/drain doping profile may be substantially the same as the second source/drain doping profile.

In even other embodiments, the first gate length may be formed substantially equal to the second gate, the first tub doping profile may be different from the second tub doping profile, or the first source/drain doping profile may be different from the second source/drain doping profile. The process may also be varied by forming the first gate length different from the second gate length, forming the first tub doping profile that is substantially the same as the second tub doping profile, or employing a first source/drain doping profile that is different from the second source/drain doping profile. In yet another embodiment, the first and second transistors may be formed simultaneously.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
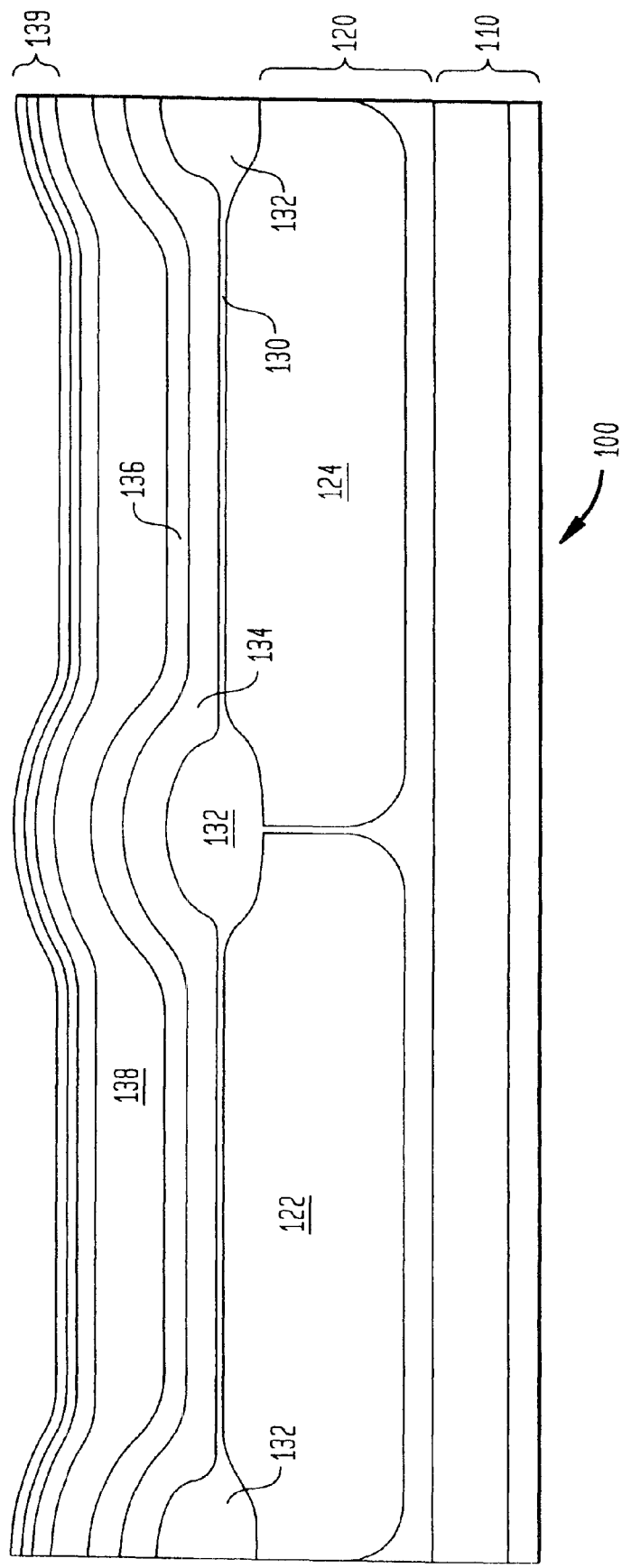
FIG. 1 illustrates a sectional view of one portion of an exemplary, conventional semiconductor wafer at an early phase of manufacture.

Referring initially to FIG. 1, illustrated is a sectional view of one portion of an exemplary, conventional semiconductor wafer at an early phase of manufacture. The semiconductor wafer, generally designated 100, comprises a silicon substrate 110, an epitaxial silicon layer 120, and a gate oxide layer 130. Conventionally formed within the epitaxial silicon layer 120 are a p-tub region 122 and an n-tub region 124. A plurality of field oxides 132 are also formed on the silicon substrate 110. The gate oxide layer 130 may be formed to a thickness of about 1 nm to about 20 nm. A gate layer 134, which may be comprised of a gate material such as polysilicon, is blanket deposited on the field oxides 132 and the gate oxide layer 130 by conventional deposition processes. Next, a silicide layer 136, such as tungsten silicide ($WSi_x$) is conventionally blanket deposited on the gate layer 134. The gate layer 134 may then be ion implanted with phosphorus in a conventional manner. In some embodiments, the tungsten silicide layer 136 deposition is followed by the deposition of a hard mask layer 138 and a three layer dielectric antireflective coating (DARC) layer 139. A photoresist mask is deposited and developed by conventional photolithographic processes and conventional etch techniques are conducted to form gate structures from these layers, as illustrated in FIG. 2 below.

Figure 2:
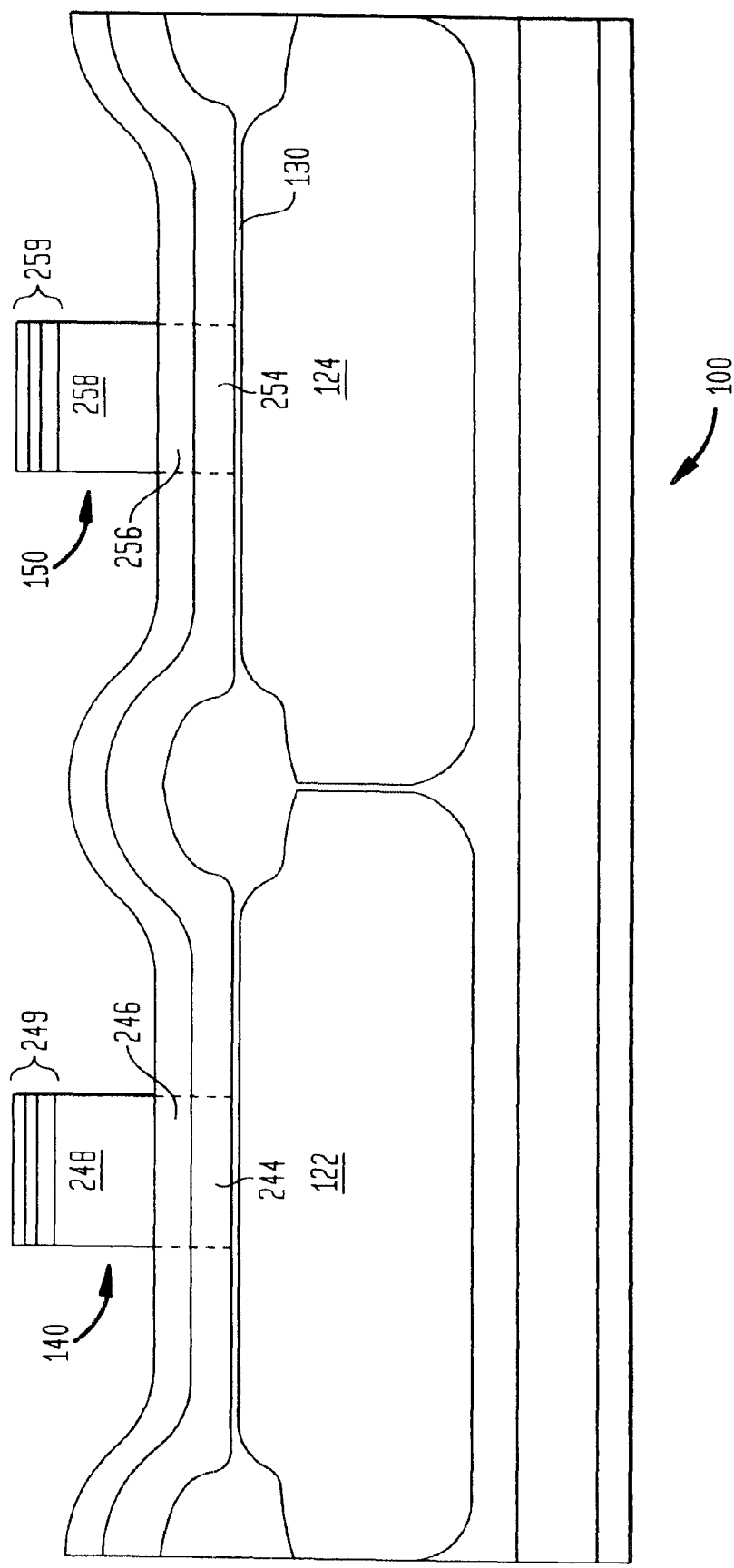
FIG. 2 illustrates a sectional view of the semiconductor wafer of FIG. 1 after the formation of the transistor gates.

Turning now to FIG. 2, a first gate 240 structure is formed on the gate oxide layer 130 over the p-tub region 122 by conventional photolithographic processes as just mentioned. The gate structure 240 includes, a polysilicon region 244, a tungsten silicide ($WSi_x$) region 246, a hard mask remnant 248, and DARC remnants 249. Similarly, a second gate structure 250 is formed on the gate oxide layer 130 over the n-tub region 124. The second gate structure 250 includes, a polysilicon region 254, a tungsten silicide ($WSi_x$) region 256, a hard mask remnant 258, and DARC remnants 259. Additional processing will complete the manufacture of the gates 140, 150 to their finished configuration. In a particularly advantageous embodiment, the first and second gates 140, 150 are formed simultaneously from the layers previously discussed. The gate oxide 130 layer, on which both the first and second gates 140, 150 are located, is formed to a single thickness that may range from about 1 nm to about 20 nm, and in specific embodiments, may range from about 3 nm to about 10 nm to optimize performance for different operating voltages, such as either 3.3 volts or 2.5 volts. This is a distinct advantage over integrated circuits fabricated using prior art methods in which the gate oxide thickness was primarily optimized to either a higher voltage or a lower voltage gate. In these prior art devices, such configurations have associated with them a distinct disadvantage because while the gate thickness was optimized to one voltage, it would not operate efficiently with respect to the voltage to which it was not optimized. Additionally, while only two different gate structures have been discussed, it should be appreciated that a third gate or more may also be formed on the gate oxide layer 130 along with the first and second gates 240 and 250. The third gate can be optimized to an operating voltage that is similar to the operating voltage of either of the first or second gates 240 and 250, or it may be optimized to a completely different operating voltage, if desired.

Figure 3:
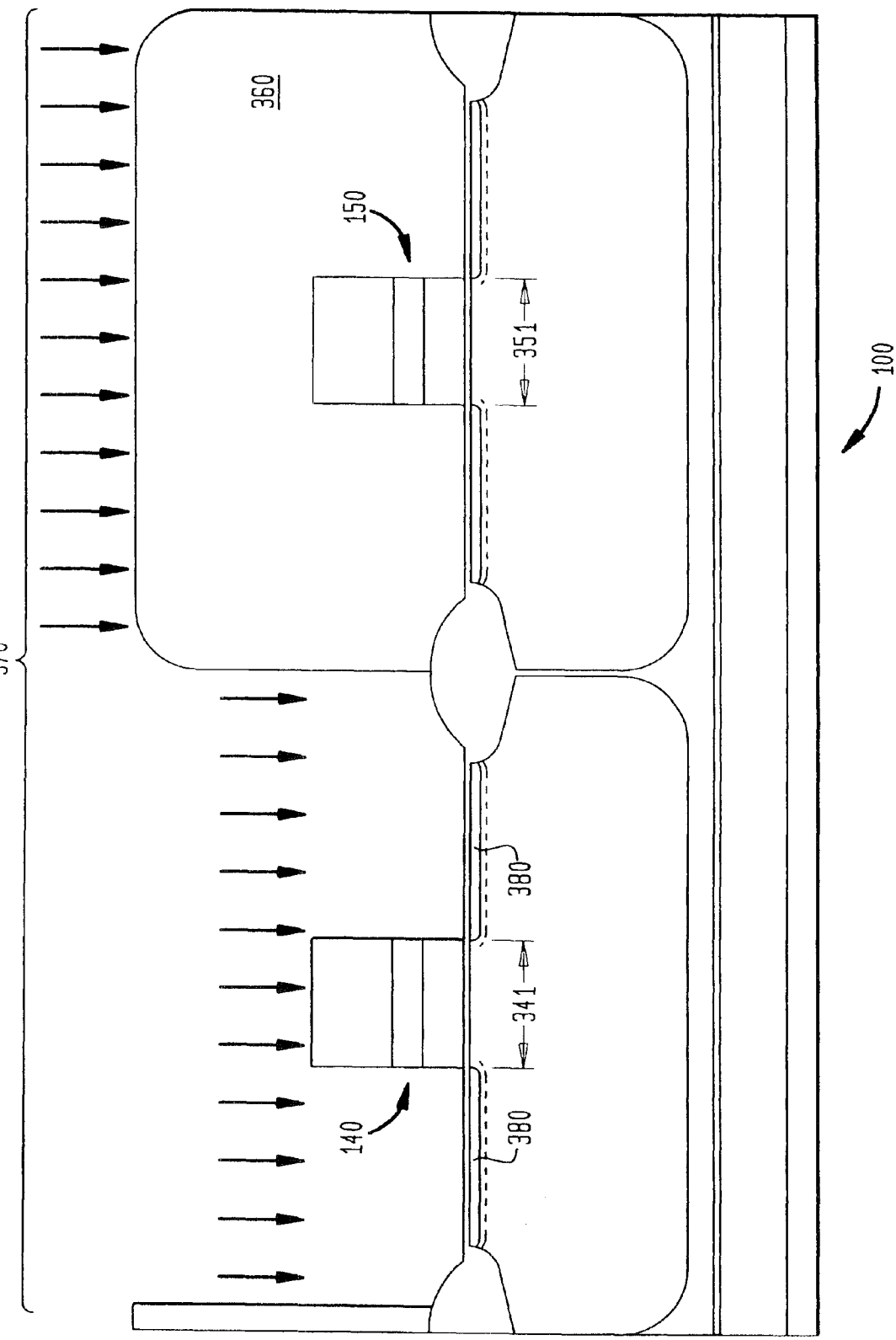
FIG. 3 illustrates the semiconductor wafer of FIG. 2 after additional processing in accordance with the principles of the present invention.

Referring now to FIG. 3, illustrated is the semiconductor wafer of FIG. 2 after additional processing in accordance with the principles of the present invention. In an advantageous embodiment, a photoresist layer 360 has been applied to the region about the second gate 150, masking the second gate 150 from a doping 370 of the first gate 140. In such embodiments, gate lengths 341, 351 of gates 140, 150, respectively, may be optimized for the intended circuit voltage, for example 2.5 volts or 3.3volts. In NMOS applications, for example, the gate length 341, 351 may be about 0.24±0.04 µm for 2.5 volt applications, or alternatively, for 3.3 volt applications, the gate length may be about 0.32±0.04 µm. In those PMOS embodiments where the gate is optimized for either application, the gate length 341, 351 may be about 0.28±0.04 µm. In one embodiment, the region about the first gate 140 may be lightly n-doped 370 with phosphorous forming an n-channel 380 adjacent the first gate 140. In an alternative embodiment, the first gate 140 may be lightly n-doped 370 with arsenic to form the n-channel 380. One who is skilled in the art will recognize that a third, fourth or n-th gate may be likewise simultaneously formed with the first gate 140 or second gate 150, with the gate length and doping schedule being adjusted as required to optimize for 2.5 volt or 3.3 volt operation.

In an alternative embodiment, the region about the first gate 140 may be lightly p-doped with boron or boron difluoride forming a p-channel 380 adjacent the first gate 140. One who is skilled in the art is familiar with the conventional processes of doping semiconductor wafers with phosphorous, arsenic, boron, or boron difluoride. It should be noted by one skilled in the art that the selective masking of one gate while doping an adjacent gate allows the selected gate to be optimally doped for either 2.5 volt or 3.3 volt operation.

Figure 4:
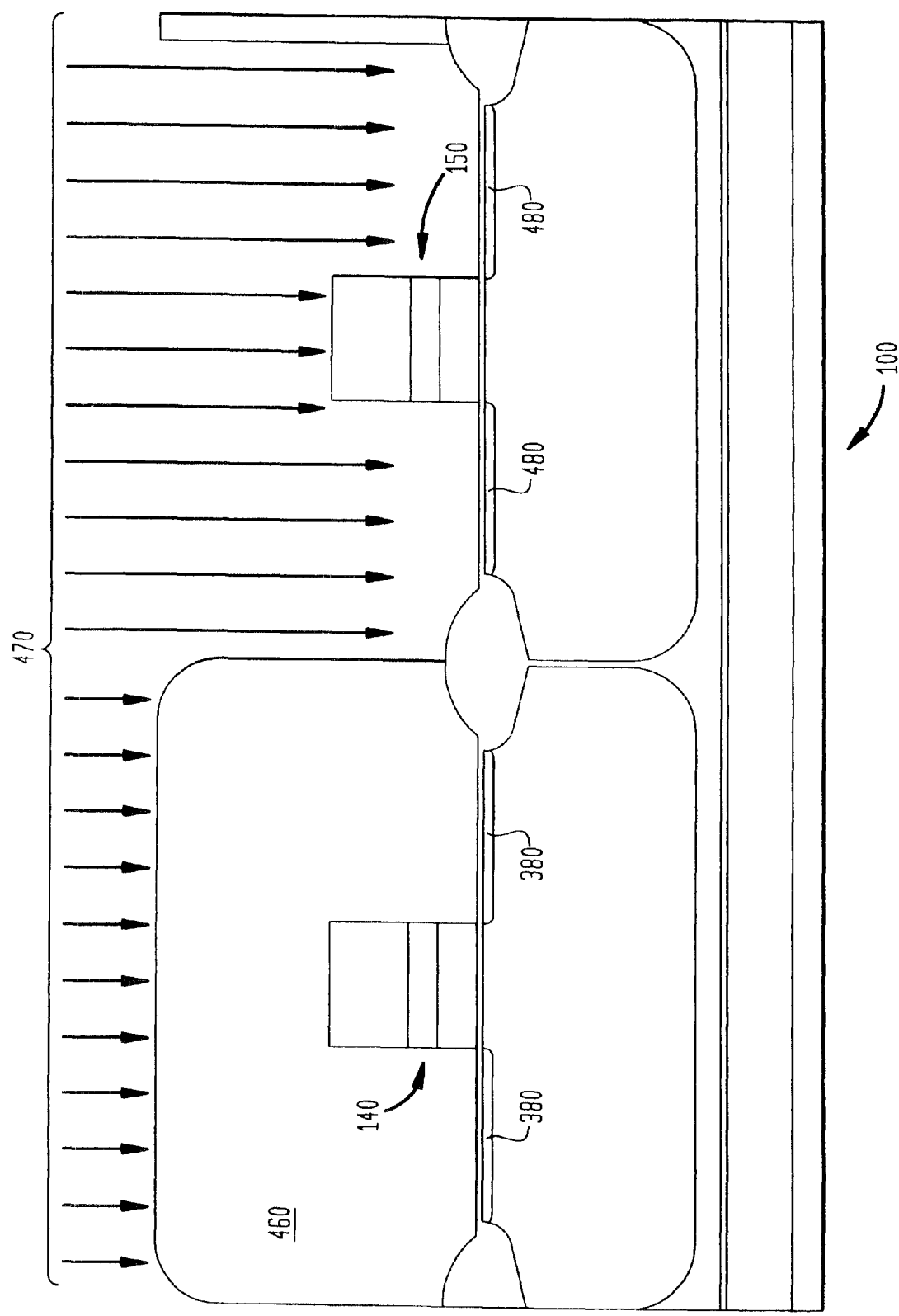
FIG. 4 illustrates the semiconductor wafer of FIG. 3 after additional intermediate processing.

Referring now to FIG. 4 with continuing reference to FIG. 3, illustrated is the semiconductor wafer of FIG. 3 after additional intermediate processing. The semiconductor wafer 100 has been prepared by removal of the photoresist layer 360 of FIG. 3, and application of a new photoresist layer 460 to the region about the first gate 140. Areas 380 adjacent gate 140 comprise source and drain regions 380. One who is skilled in the art is familiar with the conventional processes used to strip photoresist layers from semiconductor wafers. In this embodiment, the second gate 150 is lightly p-doped 470 with boron or boron difluoride forming a p-channel 480 adjacent the second gate 150. Those who are skilled in the art are familiar with the necessary additional conventional processes to complete the formation of the gates and the interconnection layer to form semiconductor circuits.

Figure 5:
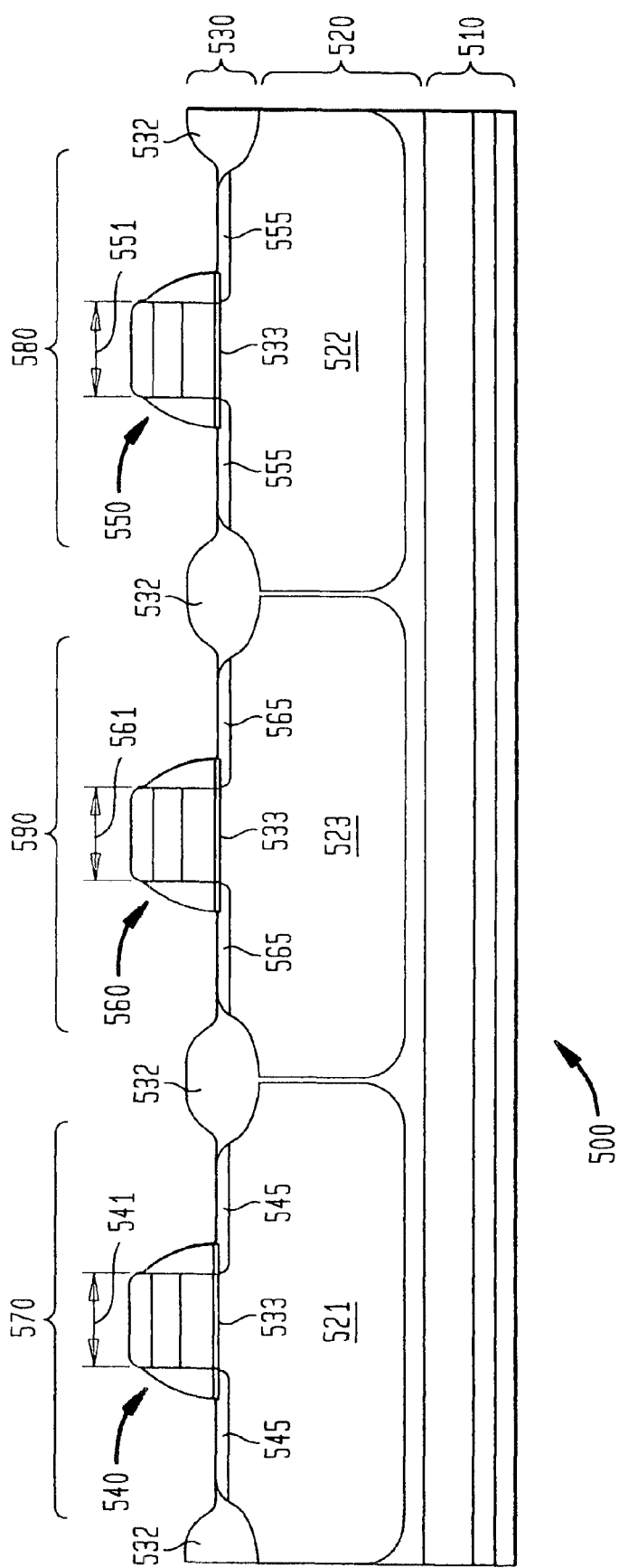
FIG. 5 illustrates one embodiment of a semiconductor wafer with multiple devices of differing operating voltages formed on a single semiconductor substrate in accordance with the principles of the present invention.

Referring now to FIG. 5, illustrated is an embodiment of a semiconductor wafer with multiple devices of differing operating voltages formed on a single semiconductor substrate in accordance with the principles of the present invention. A semiconductor wafer 500 comprises a silicon substrate 510, an epitaxial silicon layer 520, a gate oxide layer 530. Conventionally formed within the epitaxial silicon layer 520 are a first p-tub region 521, a second p-tub region 522, an n-tub region 523. A plurality of field oxides 532 are also formed on the silicon substrate 510 using conventional processes. First, second and third gates 540, 550, 560 are formed on the first p-tub region 521, second p-tub region 522, and the n-tub region 523, respectively on a gate oxide layer 533. It should be noted that the gate oxide 533 is a single gate oxide layer having a substantially uniform thickness under each of the gates 540, 550, 560. First, second and third gate lengths 541, 551, 561 are associated with the first, second and third gates 540, 550, 560, respectively. First n-doped source /drain regions 545 have been formed in the first p-tub region 521. Likewise, second n-doped source/drain regions 555 have been formed in the second p-tub region 522 and third p-doped source/drain regions 565 have been formed in the n-tub region 523. For this discussion, the first p-tub region 521, first n-doped source/drain regions 545, and first gate 540 comprise a first n-doped metal oxide semiconductor (NMOS) device 570 operating at a first operating voltage, e.g., 2.5 volts. The first NMOS device 570 is optimized for the first operating voltage by varying one or more of the following: a doping profile of the first p-tub region 521, a doping profile of the n-doped source/drain regions 545, or the first gate length 541.

Similarly, the second p-tub region 522, second n-doped source/drain regions 555, and second gate 550 comprise a second NMOS device 580 operating at a second operating voltage, e.g., 3.3 volts. Similarly, the second NMOS device 580 is optimized for the second operating voltage by varying one or more of the following: a doping profile of the second p-tub region 522, a doping profile of the n-doped source/drain regions 555, or the second gate length 551. The n-tub region 523, p-doped source/drain regions 565, and third gate 560 comprise a p-doped metal oxide semiconductor (PMOS) device 590 operating at a third operating voltage. The PMOS device 590 is optimized for the third operating voltage by also varying one or more of the following: a doping profile of the n-tub region 523, a doping profile of the p-doped source/drain regions 565, or the gate length 561. In the illustrated embodiment, the third operating voltage may by the same as either the first operating voltage, i.e., 2.5 volts, or the second operating voltage, i.e., 3.3 volts.

It should be noted that although the illustrated embodiment comprises first and second NMOS devices 570, 580 and one PMOS device 590, other embodiments with two PMOS devices and one NMOS device could also be constructed according to the principles of the present invention. One who is skilled in the art will readily conceive of a single semiconductor wafer having n PMOS devices and m NMOS devices formed thereon, where n and m may be any numbers greater than or equal to one. Thus, a plurality of transistors may be optimized for a desired operating voltage by varying a the tub doping profile, the source/drain doping profile, or the gate length.

Figure 6:
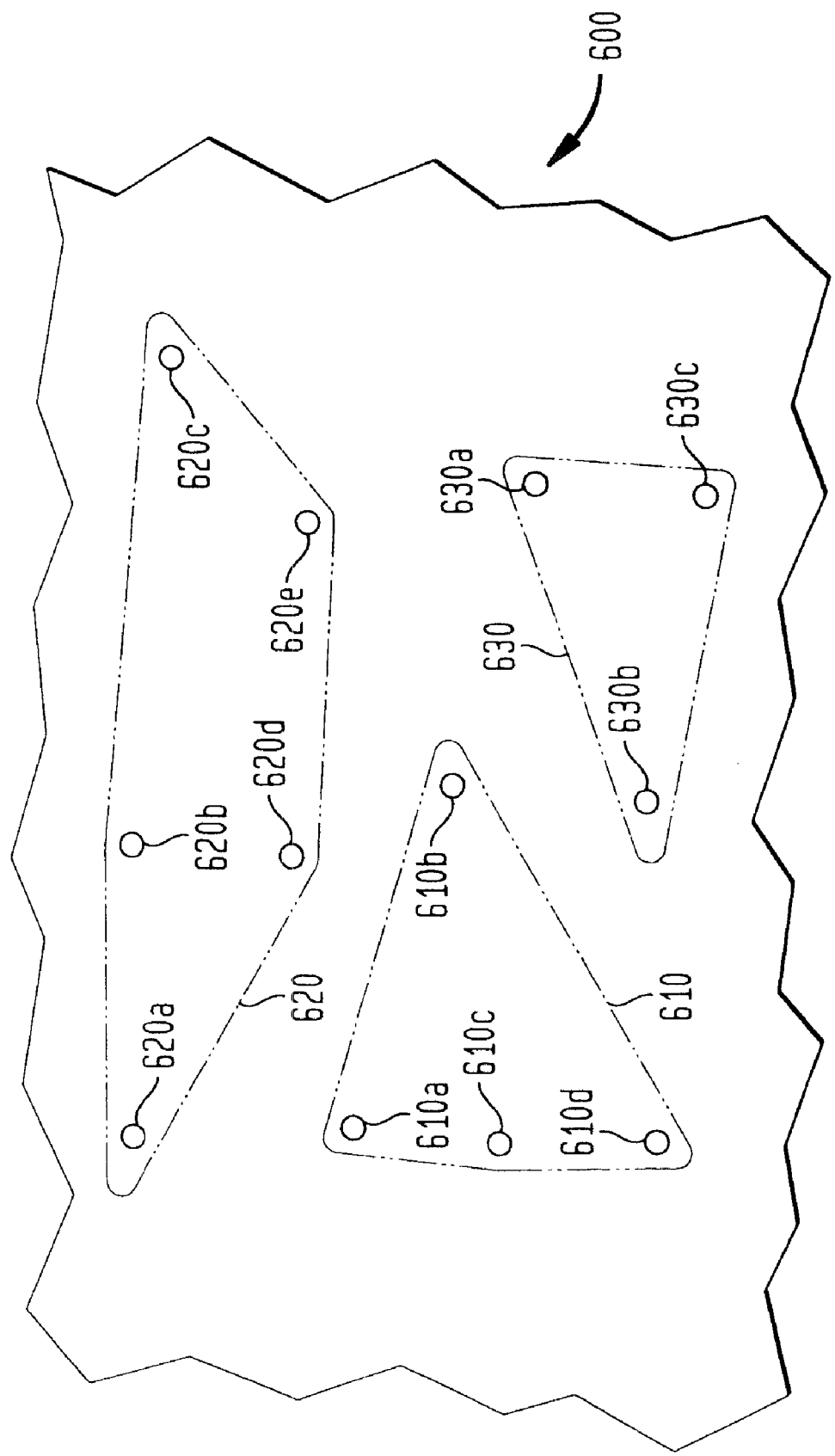
FIG. 6 illustrates a plan view of one portion of an exemplary semiconductor die with multiple transistor gates formed thereon in accordance with the principles of the present invention.

Referring now to FIG. 6, illustrated is a plan view of one portion of an exemplary semiconductor die with multiple transistor gates formed thereon in accordance with the principles of the present invention. A semiconductor die 600 comprises a plurality of first transistor gates, a region generally designated 610, a plurality of second transistor gates, region 620, and a plurality of third transistor gates, region 630. As can be seen in FIG. 6, the shape of a region consisting of like transistor gates need not be regular or geometric in shape, but may be highly irregular. The transistor gates 610a–610d, 620a–620e, 630a–630c connect to a plurality of underlying transistors (not shown) which form a plurality of transistor systems. One who is skilled in the art will appreciate that the transistors underlying gate regions 610, 620, 630 are readily integrated to form individual circuits and larger integrated circuits or modules designed to perform a specific task. In one embodiment, the transistor systems may be formed simultaneously. Additionally, one who is skilled in the art is familiar with the manufacture and use of semiconductor transistors and transistor circuits/systems.

In one embodiment of the semiconductor die, the first transistor gates 610a–610d and third transistor gates 630a–630c may be formed over respective p-tubs. Similarly, the second transistor gates 620a–620e may be formed over an n-tub. In an alternative embodiment, the third transistor gates 630a–630c may be formed over an n-tub as required by an intended circuit. In yet another alternative embodiment, the first transistor gates 610a–610d and third transistor gates 630a–630c may be formed over respective n-tubs, and the second transistor gates 620a–620e may be formed over a p-tub. The manufacture of complementary metal oxide semiconductors (CMOS) is well known to those who are skilled in the art. In a preferred embodiment, the gate oxide of the transistor gates 610a–610d, 620a–620e, 630a–630c is formed to a thickness ranging from about 1 nm to about 20 nm. One who is skilled in the art will recognize that the number and location of the various gates, as well as the type (p or n) of underlying tub may be varied as required for an intended circuit while remaining within the scope and intent of the present invention.

In one embodiment of the present invention, the first transistor gate region 610 and the third gate region 630 may be doped with a first doping scheme for an intended first operating voltage, while the second gate region 620 is masked against the doping. In the completion of the processing for this embodiment, the second gate region 620 is doped with a second doping scheme as appropriate for an intended second operating voltage, while the first and third gate regions 610, 630 are masked against the doping. In an alternative embodiment, the third gate region 630 may be doped simultaneously with, and in the same manner as, the second gate region 620 by appropriate masking of the first gate region 610. In the embodiments listed, an n-channel or p-channel is formed adjacent the selected gate as determined by the doping agent and gate masking.

One who is skilled in the art will recognize that the present invention may be readily extended to a third, a fourth, or even to an n-th gate depending upon the requirements of the desired semiconductor circuit. Those additional gates, i.e., third, fourth, . . . , n-th, individually may be over either an n-tub or a p-tub and may be sized and appropriately n-doped or p-doped with phosphorous, arsenic, boron, or boron difluoride, as appropriate and required for the intended circuit.

Although the present invention has been described in detail, those skilled in the art should understand that they can make various changes, substitutions and alterations herein without departing from the spirit and scope of the invention in its broadest form.

What is claimed is:

1. A semiconductor wafer substrate having merged integrated circuits formed thereon, comprising:
    a gate oxide on said semiconductor wafer substrate;
    a first transistor formed on said gate oxide and optimized to a first operating voltage, said first transistor having a first gate with a first gate length, a first tub doping profile and a first source/drain doping profile; and
    a second transistor formed on said gate oxide and optimized to a second operating voltage different from said first operating voltage, said second transistor having a second gate with a second different gate length, a second tub doping profile and a second different source/drain doping profile.

2. The semiconductor wafer as recited in claim 1 wherein said first and second transistors are p-type transistors.

3. The semiconductor wafer as recited in claim 1 wherein said first and second transistors are n-type transistors.

4. The semiconductor wafer as recited in claim 1 further comprising a third transistor that is optimized to a third operating voltage.

5. The semiconductor wafer as recited in claim 4 wherein said third transistor is optimized to said first operating voltage.

6. The semiconductor wafer as recited in claim 4 wherein said third transistor is optimized to said second operating voltage.

7. The semiconductor wafer as recited in claim 1 wherein said first tub doping profile is different from said second tub doping profile.

8. The semiconductor as recited in claim 1 wherein said first tub doping profile is substantially the same as said second tub doping profile.

9. The semiconductor as recited in claim 1 wherein said gate oxide has a thickness ranging from about 1 nm to about 20 nm.

\* \* \* \* \*